United States Patent [19]

Watanabe et al.

[11] Patent Number: 5,718,603
[45] Date of Patent: *Feb. 17, 1998

[54] INSPECTION DEVICE FOR CONNECTORS AND CONNECTOR

[75] Inventors: Tamio Watanabe; Toru Nagano; Sakai Yagi, all of Shizuoka, Japan

[73] Assignee: Yazaki Corporation, Tokyo, Japan

[ * ] Notice: The term of this patent shall not extend beyond the expiration date of Pat. No. 5,512,833.

[21] Appl. No.: 659,637

[22] Filed: Jun. 6, 1996

[30] Foreign Application Priority Data

Jun. 8, 1995 [JP] Japan ................... 7-141671

[51] Int. Cl.$^6$ ................................. H01R 3/00
[52] U.S. Cl. .......................... 439/489; 439/310
[58] Field of Search ................... 439/488, 489, 439/310, 595; 324/538; 29/593

[56] References Cited

U.S. PATENT DOCUMENTS 5,512,833  4/1996  Fukuda et al. .................. 439/489

FOREIGN PATENT DOCUMENTS 63-131074  8/1988  Japan .
7-113836   5/1995  Japan .

Primary Examiner—Khiem Nguyen
Assistant Examiner—Yong Ki Kim
Attorney, Agent, or Firm—Armstrong, Westerman, Hattori, McLeland & Naughton

[57] ABSTRACT

An inspection device for connectors comprises a connector support (6) and an inspection main body (3) movable relative to each other. The main body has therein a plurality of inspection pins (11) connected to an inspecting electric circuit, which inspection pins are each urged forwardly by a spring (2). A connector to be inspected has a plurality of terminal-accommodating chambers, each containing a resilient cantilever support piece (14) and a space (16) adjacent the support piece. Each inspection pin (11) includes a continuity-test surface (11a) and an incomplete-insertion detector portion (11b) protruding forwardly of the continuity-test surface, which detector portion (11b) is at the front end formed with an abutment means (11c) engageable with a corresponding abutment means (14b) of the related support piece (14). During inspection, the detector portion (11b) enters the space (16) adjacent the support piece (14) so that the continuity-test surface contacts a terminal lug (C) in fully-inserted position in the accommodating chamber. Terminal lugs are individually inspected whether in fully-inserted or incompletely-inserted position without making errors.

6 Claims, 11 Drawing Sheets

INSPECTION DEVICE FOR CONNECTORS AND CONNECTOR

BACKGROUND OF THE INVENTION

1. Field of the Invention

This invention relates to an inspection device for connectors for use in connection of automotive wiring harnesses and the like, which enables checking whether a terminal lug is incorporated in proper position in a connector, and checking for continuity of a wire connected to the terminal lug, and also to a connector having a structure adapted for such inspection.

2. Description of the Related Art

FIGS. 12A to 12C are longitudinal sectional views of a conventional connector, shown with a terminal in the process of being inserted thereinto.

A plurality of terminal-accommodating chambers b are formed in the connector housing q, each of which contains a resilient cantilever locking piece c whereby a terminal lug is locked in position in its accommodating chamber and prevented from rearwardly slipping off. During insertion of the terminal lug d, its front end portion contacts a locking projection c1 of locking piece c to resiliently displace locking piece c inside a resilient-displacement allowing space e (FIG. 12B), and then locking piece restores its original position when terminal lug d rides thereover and the locking projection c1 is in alignment with an engagement hole d1. The terminal lug d is at this time locked in position (FIG. 12C).

Referring to FIG. 13, designated at f is an inspection device which incorporates therein tube-like inspection terminals g in correspondence with respective terminal-accommodating chambers b in the housing a. Each inspection terminal g has a slidable continuity pin h normally urged and protruding forwardly by a coil spring i. Inspection device f includes an incomplete-insertion detector arm j for detecting when a terminal lug d is in incompletely-inserted position in the housing a.

If the connector to be inspected is set on inspection device (FIG. 13), incomplete-insertion detector arm j advances into resilient-displacement allowing space, and terminal lug d locked in fully-inserted position, the lower one, abuts against the continuity pin h and pushes the same rearwardly, so that the result of the continuity test will be indicated as satisfactory by a checker k. The terminal lug d which is not locked by the locking piece c does not contact the continuity pin h, so that the test result will be indicated as unsatisfactory by the checker k. Referring Referring to FIG. 14, the upper terminal lug d is in incompletely-inserted position and resiliently displaces locking piece c to close the resilient-displacement allowing space e therebelow. If in this condition the connector is set on inspection device f, since the incomplete-insertion detector arm j abuts against the end surface of the upper locking piece c that is closing the space e, the setting cannot be completed, thereby letting it be known that the terminal lug d is in incompletely-inserted position.

The prior art as mentioned above is disadvantageous in that, if one terminal lug d is in such incompletely-inserted postion as resiliently displaces locking piece c, since the detector arm j cannot enter the space e, all the terminal lugs d in the housing a cannot be subjected to inspection, in other words, each terminal lug d cannot be individually inspected.

SUMMARY OF THE INVENTION

This invention has been accomplished to overcome the above drawbacks and an object of this invention is to provide an inspection device for connectors which enables terminal lugs to be individually detected when in incompletely-inserted position, and which gives reliable, error-free test results. This invention also seeks to provide a connector having a structure adapted for such inspection.

In order to attain the object, according to an aspect of this invention, there is provided an inspection device for connectors, which comprises: a connector support and an inspection main body movable relative to each other; a plurality of inspection pins provided in the inspection main body, each connected to an inspecting electric circuit, each normally urged towards the connector support by a spring, and each having a continuity-test surface and an incomplete-insertion detector portion protruding closer to the connector support than the continuity-test surface; a connector to be inspected which comprises a housing and a plurality of terminal-accommodating chambers formed in the housing, and terminal lugs inserted in the terminal-accommodating chambers to be locked therein, each of the terminal-accommodating chambers containing a resilient cantilever support piece and a space adjacent the support piece inside which the support piece is resiliently displaced while being contacted and pressed by the related terminal lug; and a first abutment means at a front end of each of the incomplete-insertion detector portions, which is engageable, when the related terminal lug is in incompletely-inserted position, with a second abutment means on the related support piece so that the incomplete-insertion detector portion is prevented from entering the space, and which is not engageable, when the related terminal lug is in fully-inserted position, with the second abutment means so that the incomplete-insertion detector portion is allowed to enter the space, and that the continuity-test surface is brought into contact with the related terminal lug in locked position, wherein the first abutment means comprises a tapered driving surface and the second abutment means comprises a corresponding tapered driven surface, the tapered driving surface being tapered such that, on contact with the tapered driven surface, it causes the driven surface and thus the support piece to be resiliently displaced inside the space.

In the invention as recited above, if a terminal lug is in incompletely-inserted position in the connector since the incomplete-insertion detector portion of the inspection pin abuts against the resiliently-displaced end of the support piece and is prevented from entering the resilient-displacement allowing space adjacent the support piece, the continuity-test surface of the inspection pin does not come into contact with the terminal lug, resulting in the inspection electric circuit maintained unconnected.

Preferably, the first abutment means comprises a tapered driving surface and the second abutment means comprises a corresponding tapered driven surface, the tapered driving surface being tapered such that, on contact with the tapered driven surface, it causes the driven surface and thus the support piece to be resiliently displaced inside the space.

In this way, on abutment of the first abutment means against the second abutment means, the latter always receives a force whereby it is resiliently displaced inside the space to close the same, thereby to securely prevent the advancement of the inspection pin into the space. Consequently, it is prevented that the inspection pin is forcibly pushed into the space to possibly give damages to the support piece and/or terminal lug.

According to another aspect of this invention, there is provided a connector which comprises: a housing; a plurality of terminal-accommodating chambers formed in the housing, with terminal lugs inserted in the terminal-accommodating chambers to be locked therein, each of the terminal-accommodating chambers containing a resilient cantilever support piece and a space adjacent the support piece inside which the support piece is resiliently displaced while being contacted and pressed by the related terminal lug; and an abutment means on each of the support pieces engageable, when the related terminal lug is in incompletely-inserted position, with a corresponding abutment means at a front end of an incomplete-insertion detector portion of a related inspection pin of an inspection device for connectors, so that the detector portion is prevented from entering the space.

In the invention as recited above, since the resilient support piece is at the front end provided with abutment means engageable, when the terminal lug is in incompletely-inserted position, with the incomplete-insertion detector portion of the inspection device for connectors, the advancement of the detector portion into the space adjacent the support piece is securely prevented when the terminal is in incompletely-inserted position, thereby excluding errors in inspection of connectors.

The above and other objects, features and advantages of this invention will become apparent from the following description and the appended claims, taken in conjunction with the accompanying drawings in which like parts or elements are denoted by like reference characters.

DESCRIPTION OF THE PREFERRED EMBODIMENT

Figure 1:
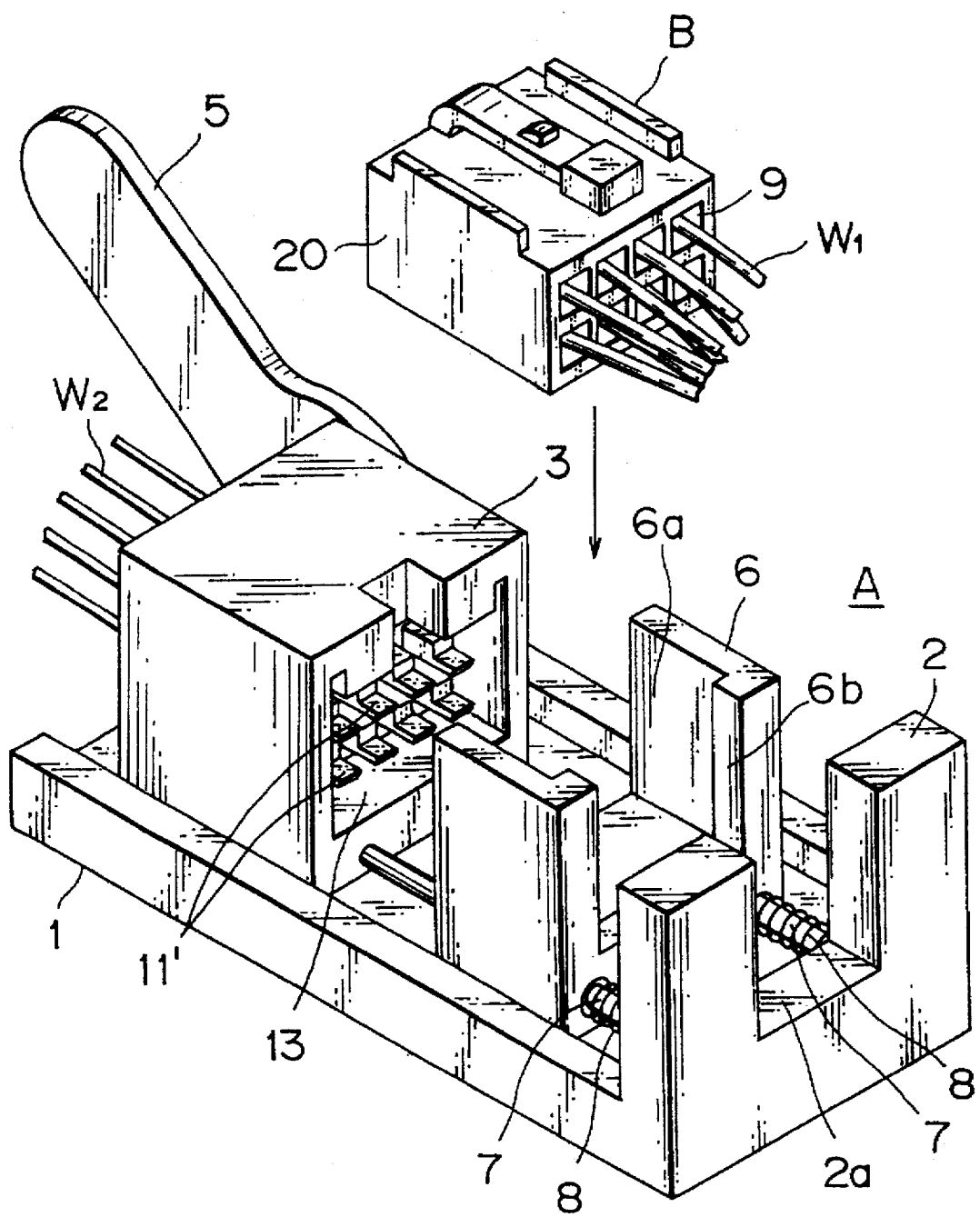
FIG. 1 is a perspective view of an inspection device according to this invention.

Embodiments of this invention will now be described with reference to the attached drawings.

Referring to FIGS. 1 to 6, an inspection device A includes a mount plate 1, a stationary wall 2 with a wire outlet 2a which is upright at one side of mount plate 1, and an inspection main body 3 movably provided at the side of mount plate 1 opposite stationary wall 2. Inspection main body 3 is synchronized to move towards and away from stationary wall 2 when an operation lever 5 is rotated about a shaft 4 thereof.

A connector support 6 is provided between stationary wall 2 and inspection main body 3. Connector support 6 includes a connector-accommodating chamber 6a which is opened upwardly and at the side towards inspection main body 3. Connector support 6 has a wire outlet 6b at the side towards stationary wall 2. Guide rods 7 extend from stationary wall 2 to inside connector support 6, and connector support 6 is normally urged towards inspection main body 3 by coil springs 8 around respective guide rods 7. Connector support 6 is against coil springs 8 moved in the opposite direction when pressed by inspection main body 3 (FIG. 4).

Figure 2:
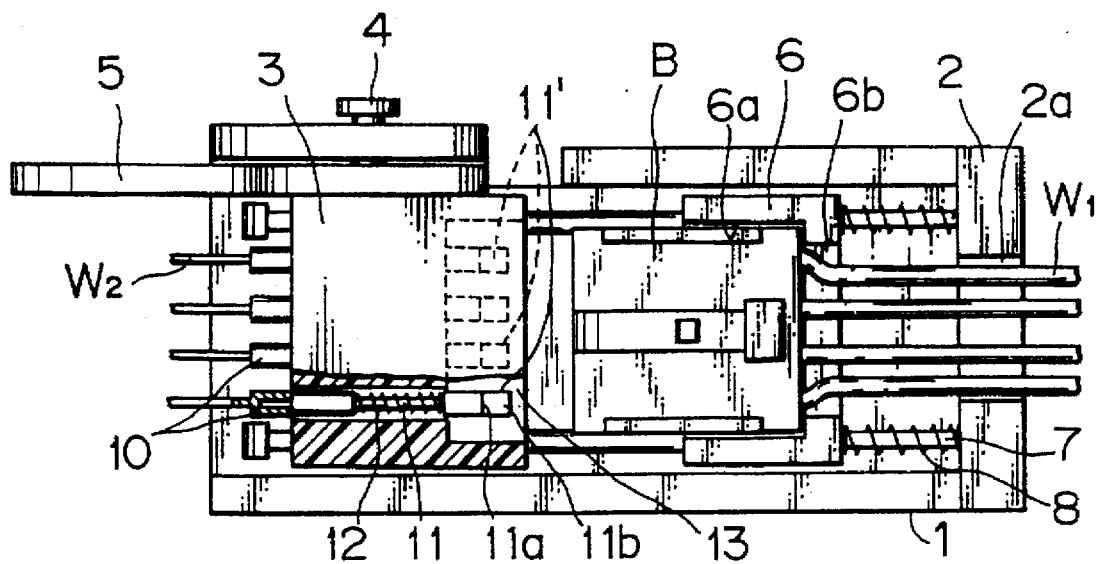
FIG. 2 is a plan view of the inspection device.
Figure 3:
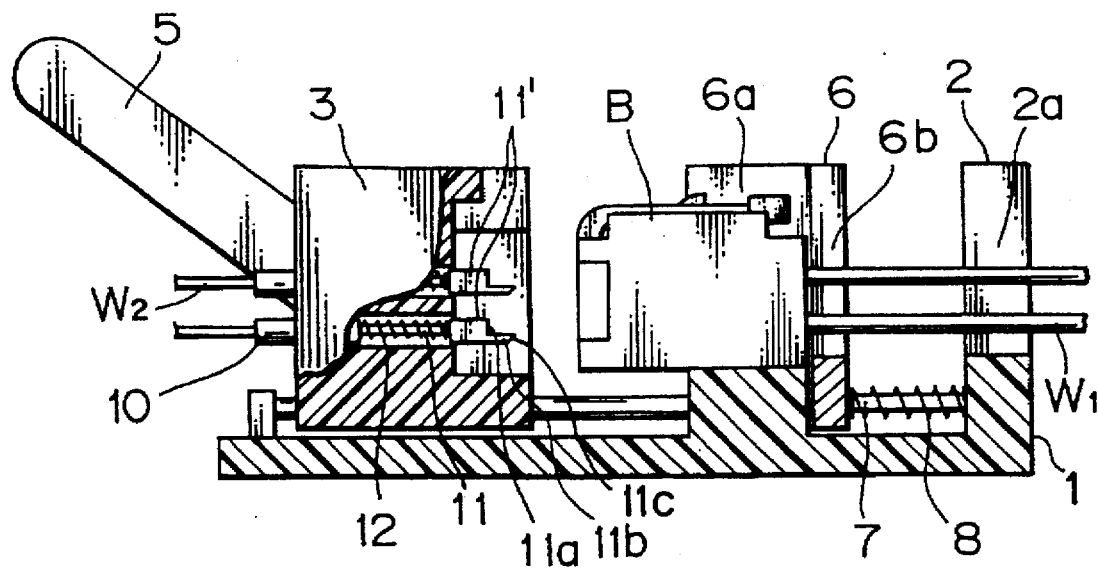
FIG. 3 is a partially cutaway side view of the inspection device.
Figure 4:
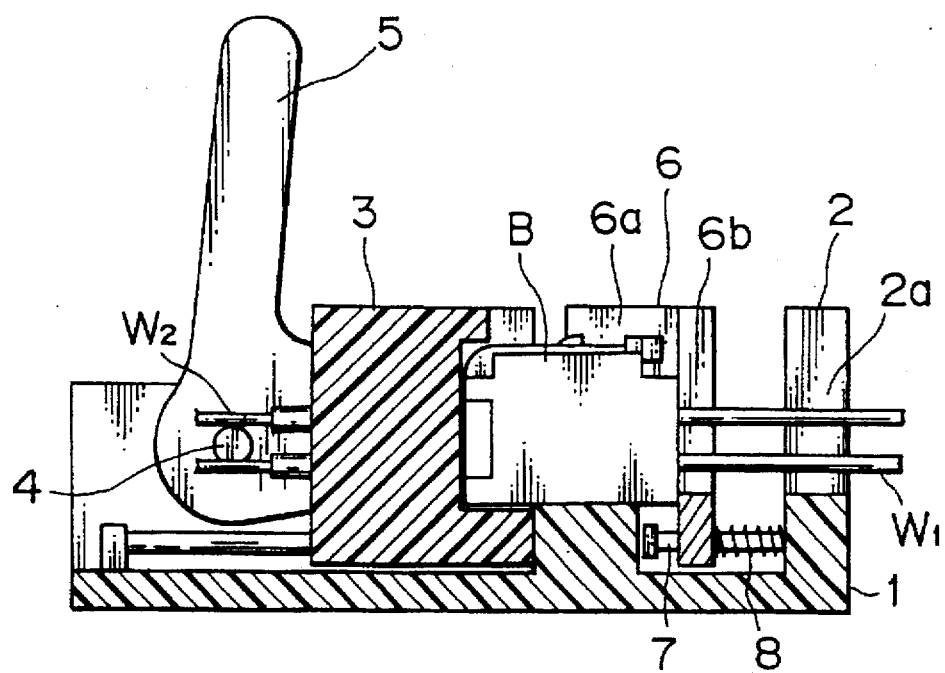
FIG. 4 is a partially cutaway side view of the inspection device during inspection being performed.

A connector B is received from above into connector support 6, with wires W1 at the rear end of connector B passed through wire outlets 6b and 2a (FIGS. 2, 3 and 4).

Inspection main body 3 has a plurality of inspection terminals 10 provided therein in correspondence with a plurality of terminal-accommodating chambers 9 formed in the housing 20 of connector B, each of the inspection terminals 10 containing a slidable pin 11 normally urged into a front inspection chamber 13 by a coil spring 12.

Figure 5:
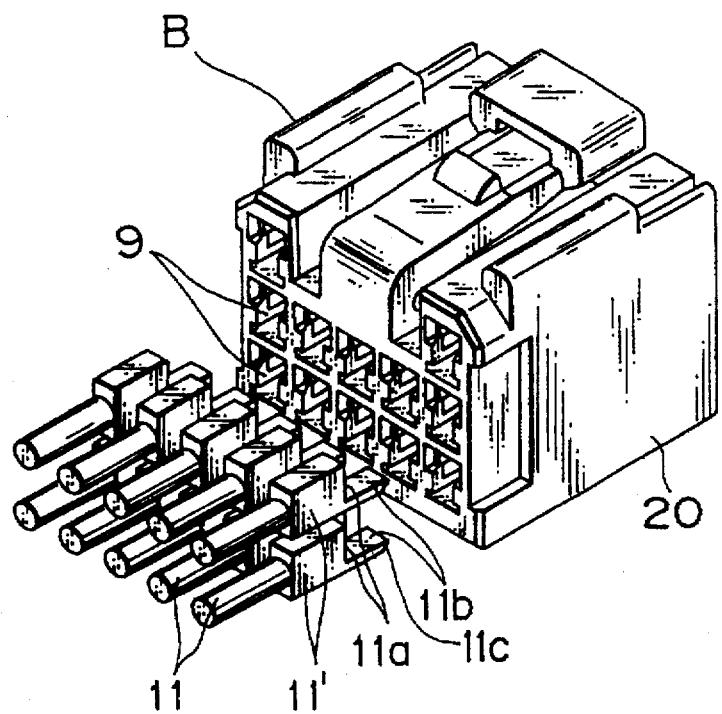
FIG. 5 is a perspective view of inspection pins, shown with a connector to be inspected.
Figure 6:
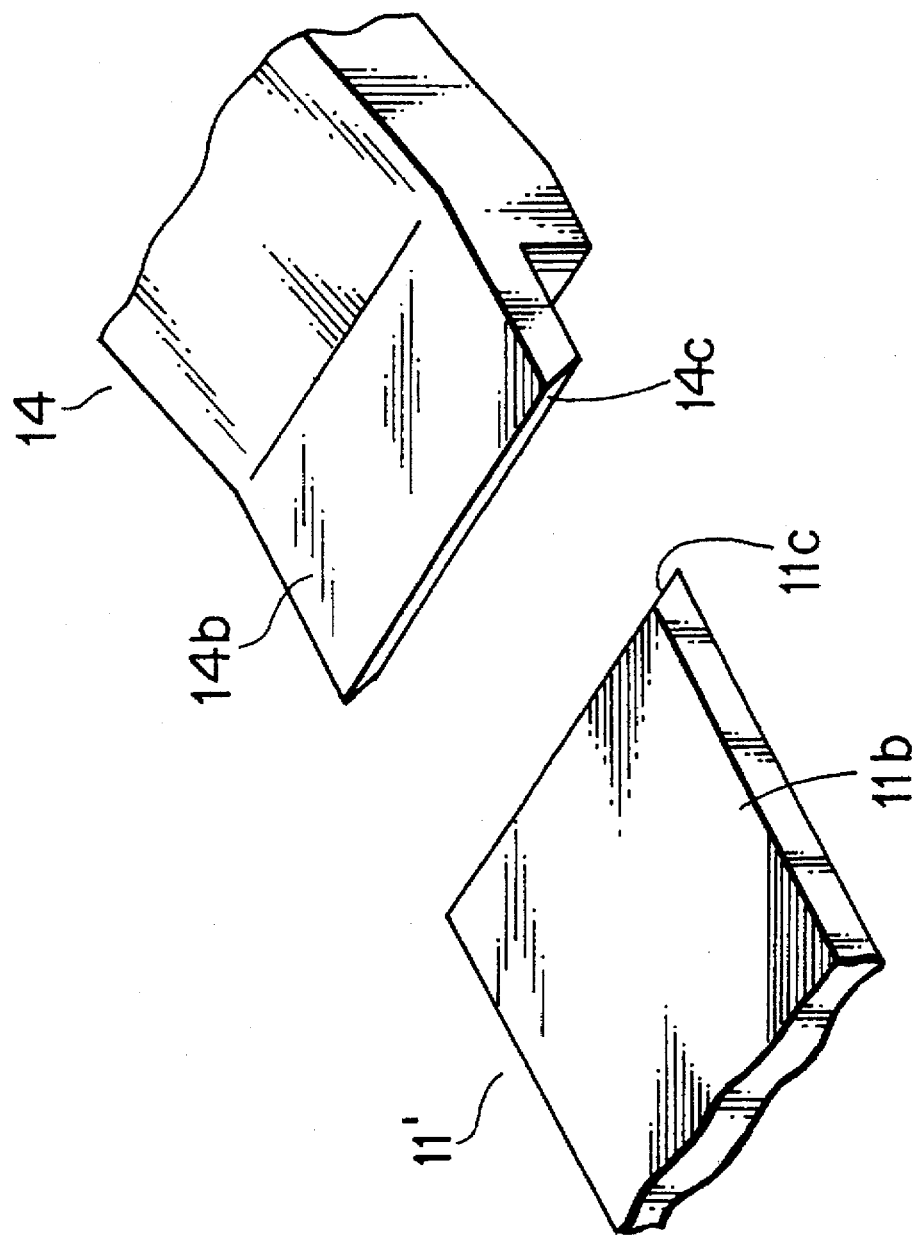
FIG. 6 is an enlarged perspective view of mating ends of an inspection member of the inspection device and of a resilient support piece in terminal-accommodating chambers.

As shown enlarged in FIGS. 5 and 6, inspection pin 11 is at the front end provided with an inspection member 11' having a continuity-testing surface 11a and an incomplete-insertion detector portion 11b extending forwardly at one side of the continuity-testing surface 11a. Detector portion 11b has a tapered driving surface 11c formed at the outside of its front end. A resilient support piece 14, which is contained in each of the terminal-accommodating chambers 9, is provided at the front end with a corresponding tapered driven surface 14c (FIG. 6) parallel to driving surface 11c. Each of the inspection terminals 10 is connected via a lead wire W2 to a checker (not-shown).

The inspection of a connector with the inspection device A will now be described.

Figure 7:
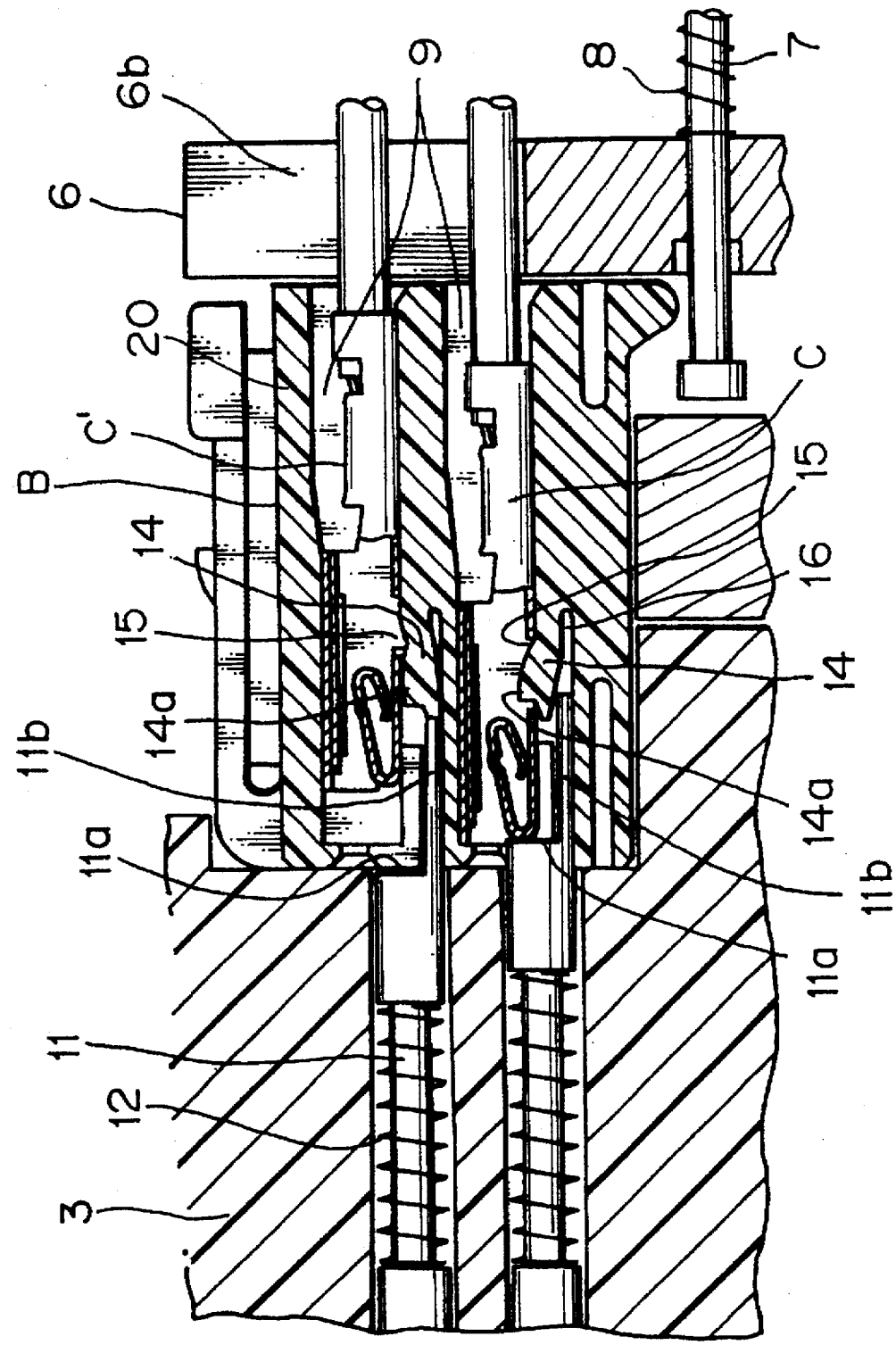
FIG. 7 is a longitudinal sectional view showing the state during inspection of a connector.

To perform the inspection, after mounting connector B into connector support 6, operation lever 5 is rotated to advance inspection main body 3 until inspection chamber 13 receives a front portion of connector B therein and inspection member 11' contacts a female terminal lug C (FIG. 7).

Referring to FIG. 7, the terminal lug C in the lower terminal-accommodating chamber 9 of connector B is fully inserted, so that a resilient cantilever support piece 14 has restored its original position, with its locking projection 14a located in an engagement hole 15 in the terminal lug C, while the terminal lug C in the upper chamber 9 is incompletely inserted, so that support piece 14 is in contact with and resiliently displaced or deflected by the terminal lug C.

In the case in FIG. 7, in the lower terminal-accommodating chamber 9, since the incomplete-insertion detector portion 11b of inspection pin 11 advances into a resilient-displacement allowing space 16 adjacent the support piece 14, the continuity-testing surface 11a contacts the terminal lug C to close the inspection electric circuit.

On the other hand, in the upper terminal-accommodating chamber 9, the incomplete-insertion detector portion 11b of inspection pin 11 abuts against the end of the resiliently displaced support piece 14 and is prevented from entering the space 16, so that the continuity-testing surface 11a is kept apart from the terminal lug C'. Consequently, continuity is not made in the inspection electric circuit, and the terminal lug C' is found by the checker as incompletely inserted.

In abutment of detector portion 11b and support piece 14 at their opposing ends, tapered driving surface 11c contacts the correspondingly tapered driven surface 4c in such manner as resiliently displaces the support piece 14 towards the space 16 to close same and to securely prevent the detector portion 11b from entering the space 16. Thus, it is most unlikely that an unsatisfactory product is erroneously found as a good one.

Figure 8:
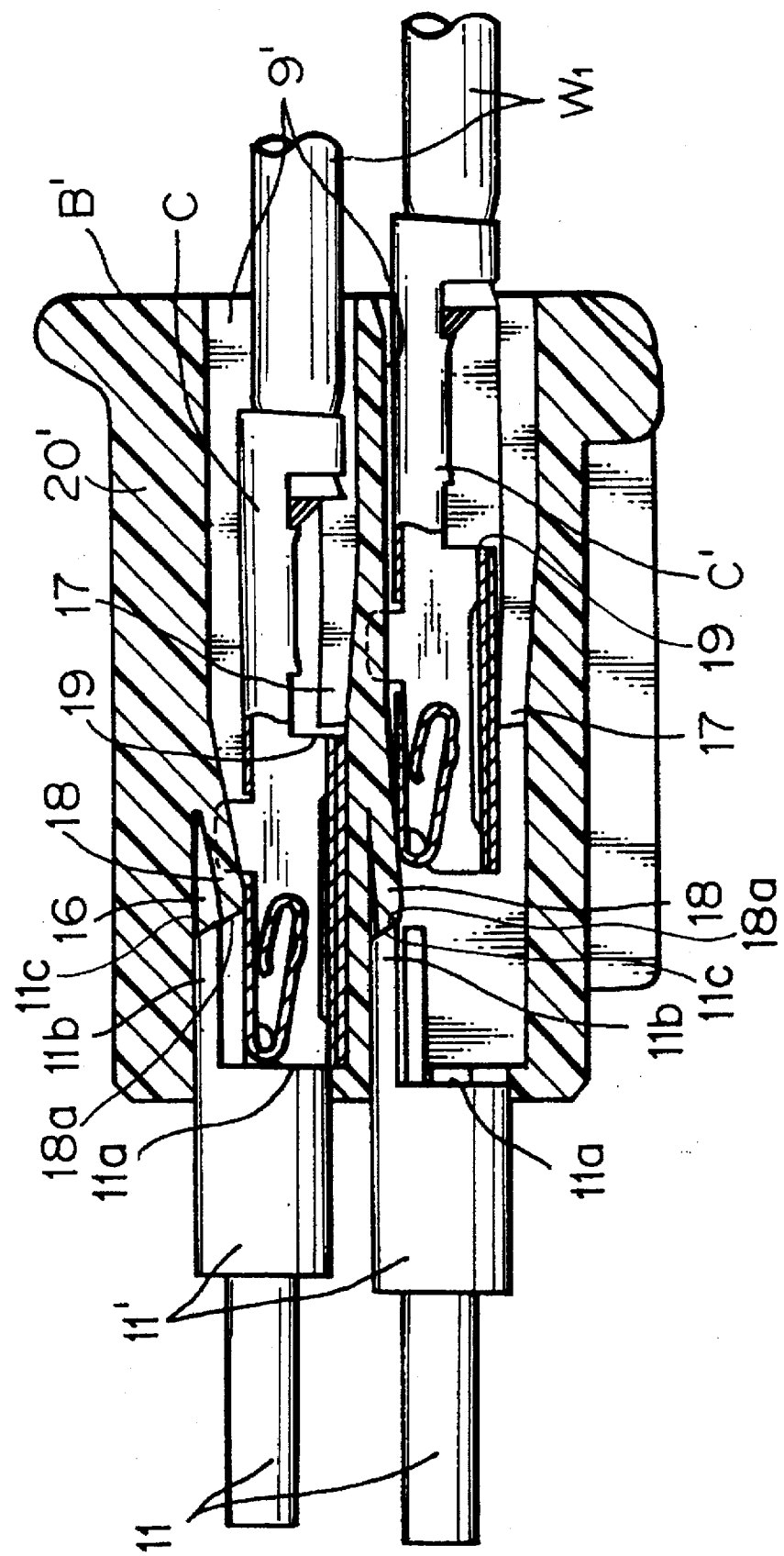
FIG. 8 is a longitudinal sectional view showing the state during inspection of another connector.

FIG. 8 shows another embodiment of this invention in which a step 17 is formed inside a terminal-accommodating chambers 9' in the connector housing 20' for locking a terminal lug in place, and a resilient cantilever support piece 18 is provided on the side opposite step 17, the support piece 18 having at the front end a tapered driven surface 18a.

In this embodiment, terminal lug C is engaged with step 17 to be locked in fully-inserted position in the upper chamber 9', and maintained in this position by its contact with support piece 18 through which terminal lug C is pressed downwardly against a bottom wall of the upper chamber 9'. In the lower chamber 9', terminal lug C' is in incompletely-inserted position, with its shoulder portion 19 riding on step 17, and the support piece 18 has not yet returned to its original position. Thus, incomplete-insertion detector portion 11b of inspection pin 11 can enter the resilient-displacement allowing space 16 in the upper chamber 9' where terminal lug C is in fully-inserted position, but cannot enter the space 16 in the lower chamber 9' where terminal lug C' is in incompletely-inserted position, because in the latter case the driving surface 11c of detector portion 11b abuts against driven surface 18a at the end of the support piece 18, so that no continuity will be detected.

Figure 9:
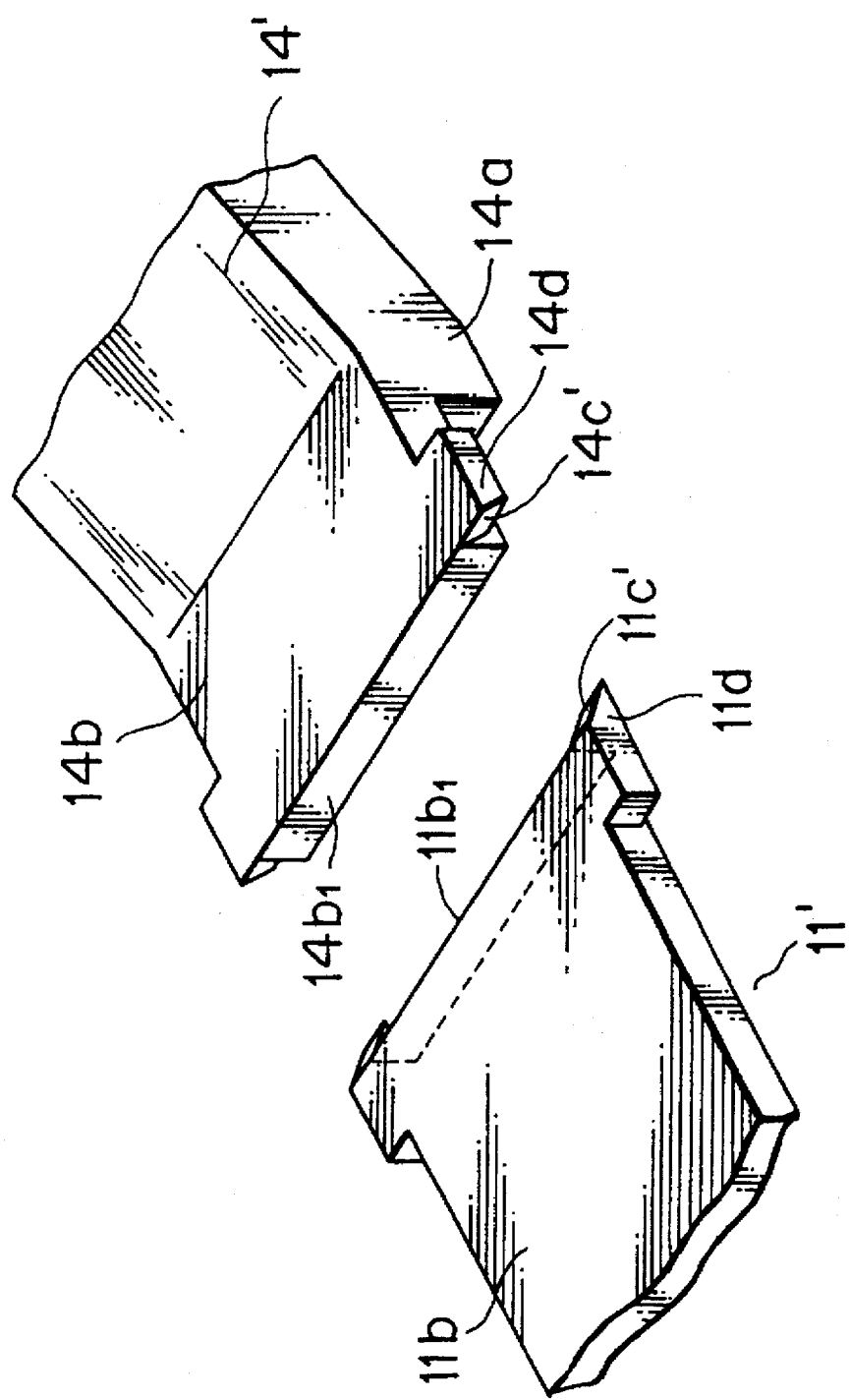
FIG. 9 is an enlarged perspective view of mating ends of different construction from that shown in FIG. 6.

Referring to FIG. 9, an incomplete-insertion detector portion 11b is at opposite sides of its end surface (abutment surface) 11b1 provided with driving pieces 11d, each having a tapered driving surface 11c' protruding from the plane in which end surface 11b1 lies. The locking projection 14a of the resilient support piece 14' to be provided in terminal-accommodating chambers 9" in a connector housing 20" (FIG. 10) is at opposite sides of its front end provided with driven pieces 14d, each having a driven surface 14c'

Figure 10:
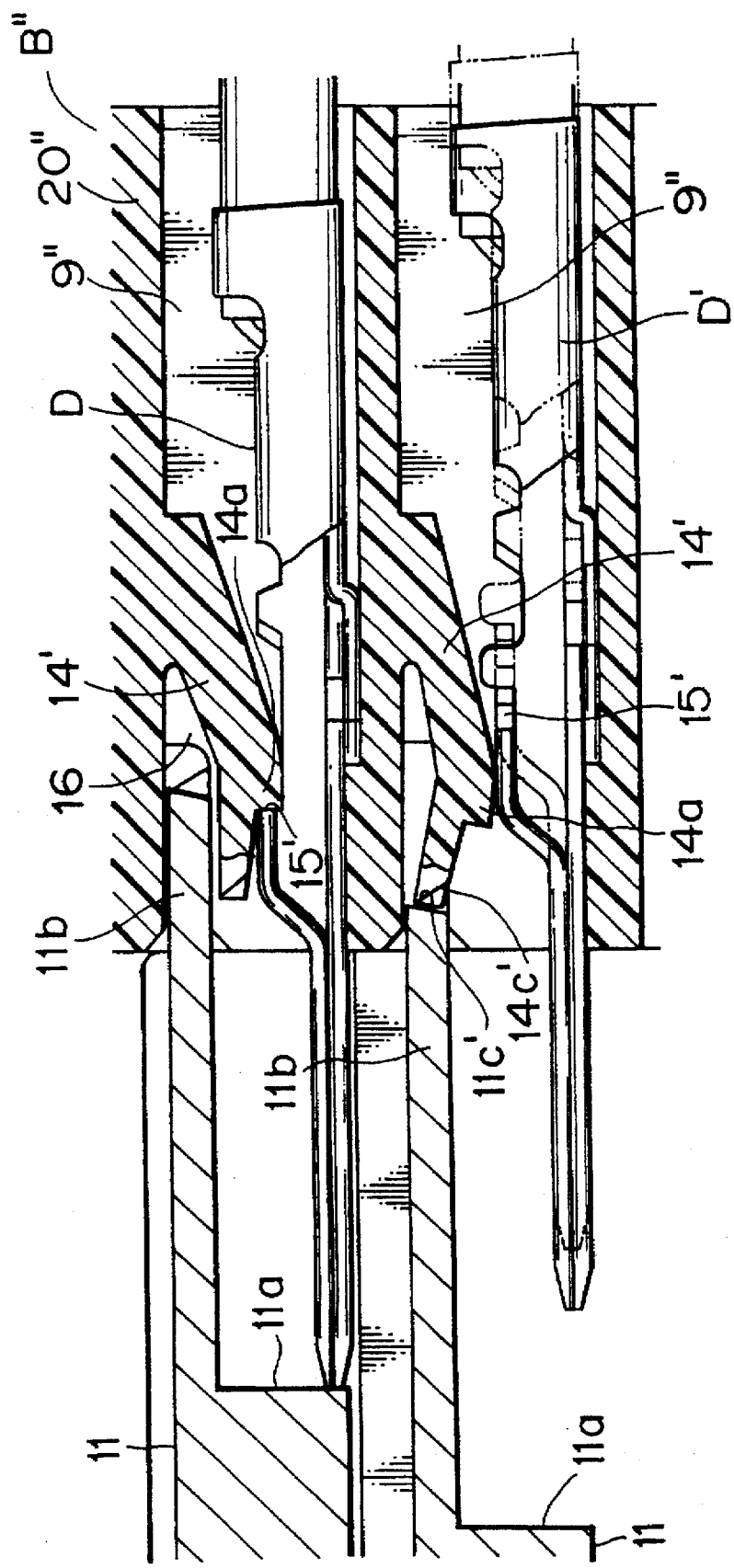
FIG. 10 is a longitudinal sectional view showing the state during inspection of yet another connector.
Figure 11:
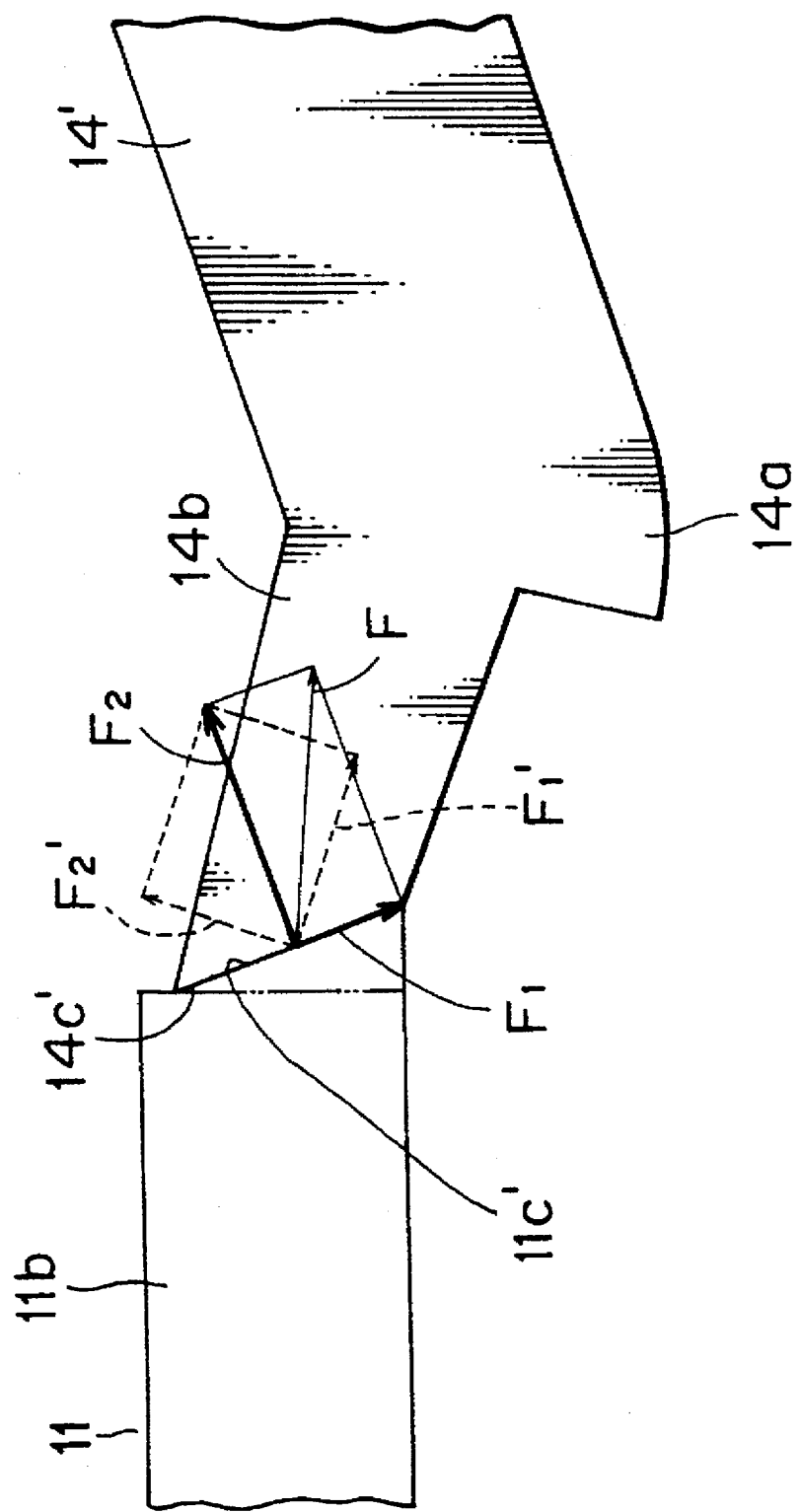
FIG. 11 is an explanatory view of the operation at the mating ends of an inspection member of the inspection device and of a resilient support piece in FIG. 10.
Figure 12A:
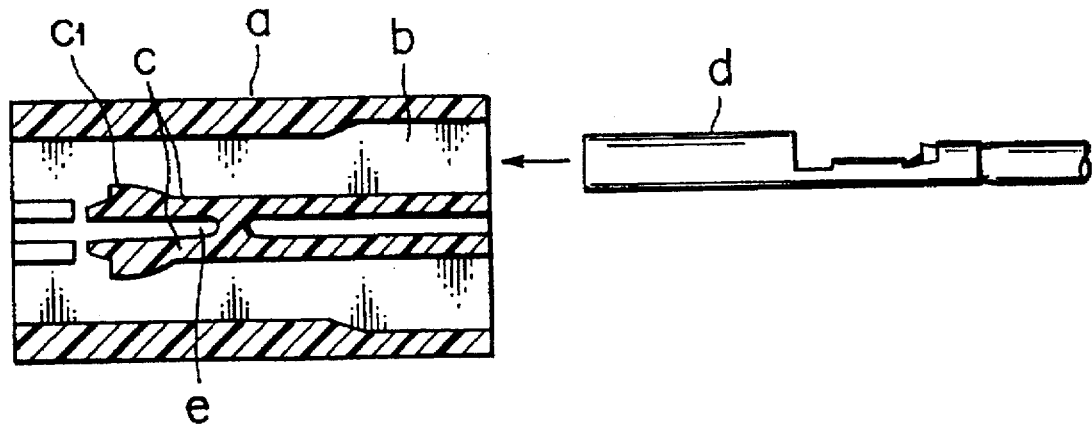
FIGS. 12A to 12C are longitudinal sectional views showing the process of insertion of a terminal lug into a conventional connector.
Figure 12B:
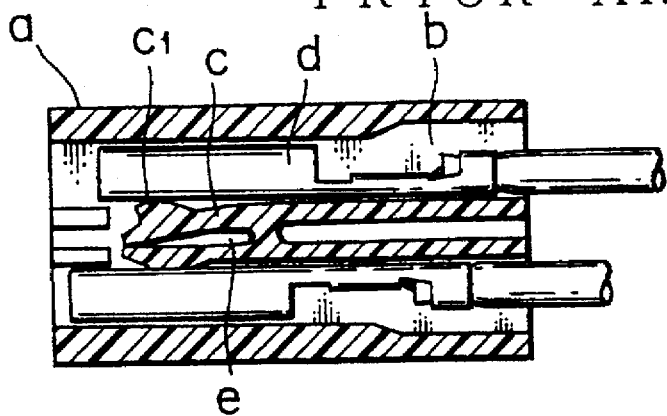
Figure 12C:
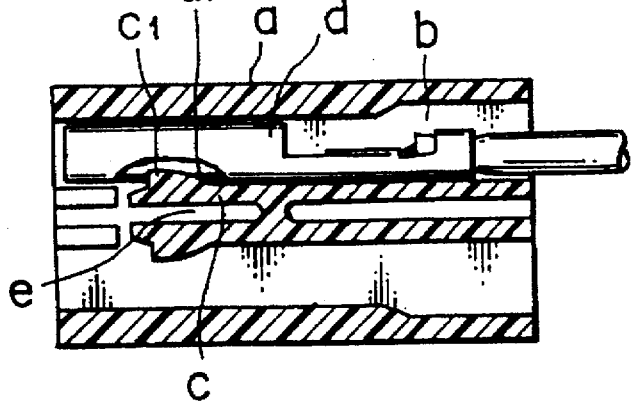
Figure 13:
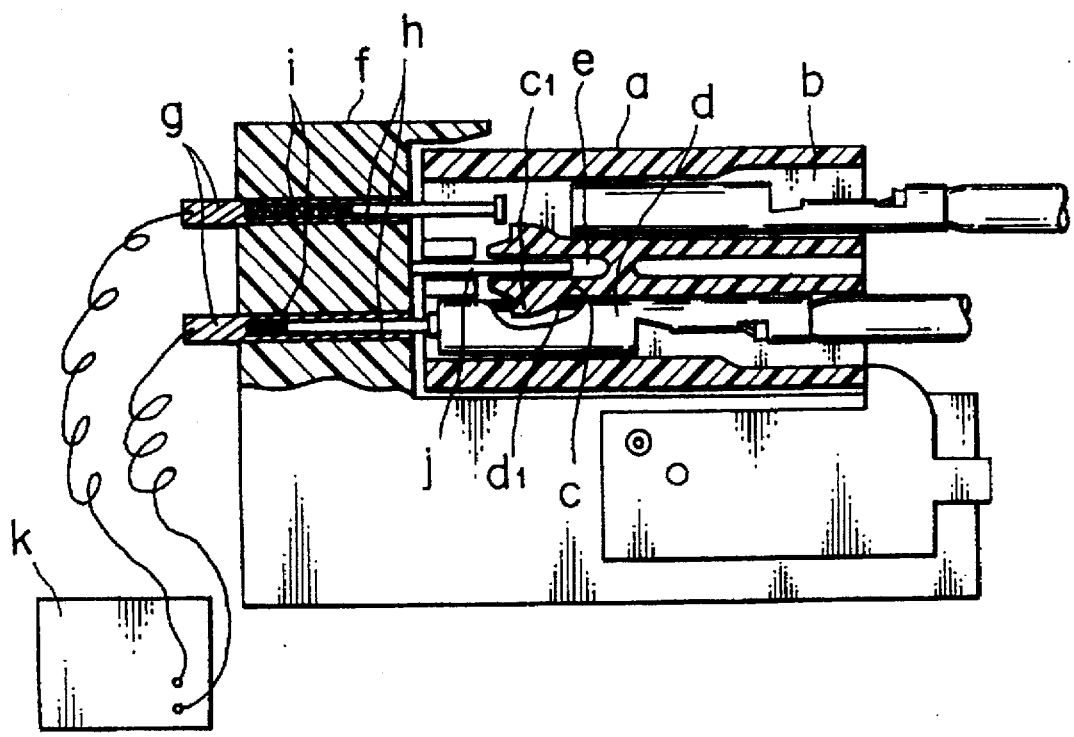
FIG. 13 is a longitudinal sectional view showing the state during inspection by a conventional inspection device.
Figure 14:
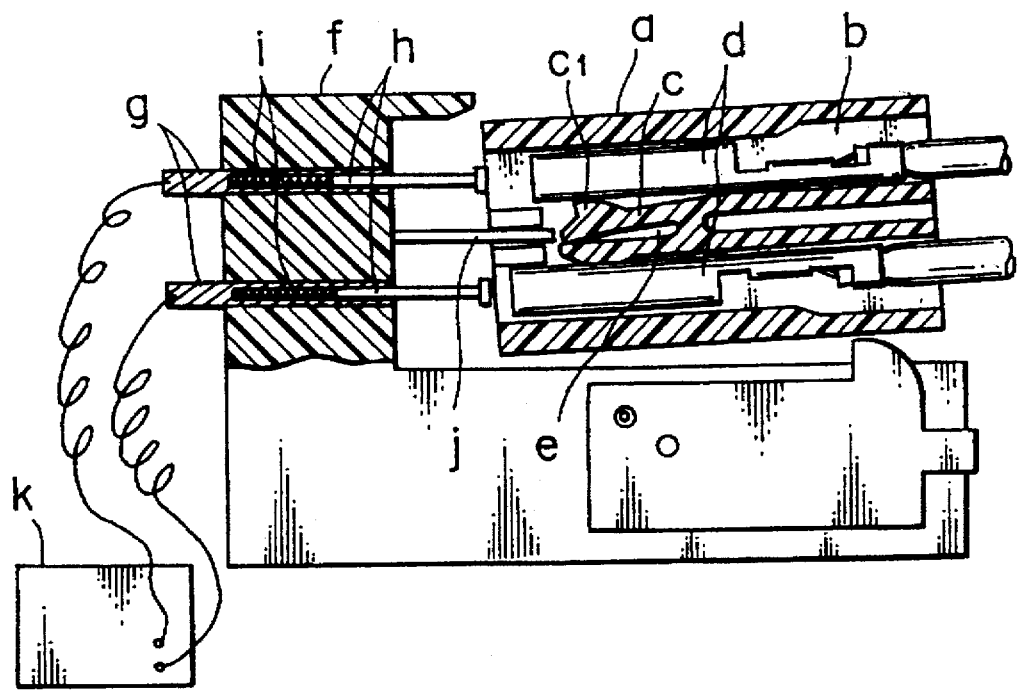
FIG. 14 is another longitudinal sectional view showing the state during inspection by the conventional inspection device.

Referring to FIG. 10, a male terminal lug D is in fully-inserted position in the upper terminal-accommodating chamber 9" of connector B", with locking projection 14a of support piece 14' being located inside an engagement hole 15' in terminal lug D to allow support piece 14' to restore its original position. The male terminal lug D' is in incompletely-inserted position in the lower terminal-accommodating chamber 9" and presses against locking projection 14a to resiliently displace support piece 14' to close space 16.

If connector B" is inspected in the same manner as described in connection with FIG. 7, in the upper chamber 9", incomplete-insertion detector portion 11b of inspection pin 11 advances into the resilient-displacement allowing space 16 adjacent support piece 14', thereby allowing the continuity-test surface 11a to contact terminal lug D to make continuity in the inspection electric circuit.

On the other hand, in the lower chamber 9", with terminal lug D' being in incompletely-inserted position, the advancement of inspection pin 11 is prevented, and the continuity-test surface 11a is maintained apart from terminal lug D', so that insufficient insertion will be indicated by the checker. In other words, incomplete-insertion detector portion 11b and support piece 14' abut against each other, with their end surfaces 11b1 and 14b1 as well as their driving and driven surfaces 11c' and 14c' brought into contact with each other. In this instance, suppose the force with which inspection pin 11 presses support piece 14' is F, components F1 and F2 will act on the driven surface 14c', the former being parallel to the driven surface 14c' and the latter perpendicular thereto. Of these, component F1 is negligible because the driven surface 14c' is of small coefficient of friction, and thus, support piece 14' receives as a whole the component F2 whereby it is resiliently displaced inside the resilient-displacement allowing space 16, so that the entrance of incomplete-insertion detector portion 11b into the space 16 is securely prevented. Therefore, an error in inspection will be precluded.

The component F2 as mentioned above may be construed as a composition of a component F1' acting in an axial direction of the front portion 14a of support piece 14' and a component F2' acting perpendicular thereto. Accordingly, when inspection pin 11 is pressed against the resilient support piece 14', to the front end portion 14a is applied a force acting in a direction along an axis of the front end portion 14a so as to least damage the same, while support piece 14' is as a whole pressed inside the resilient-displacement allowing space 16 by the perpendicular component F2'.

Further, in the lower terminal-accommodating chamber 9" in FIG. 10, suppose that the male terminal lug D' is at a slightly retreated position as indicated by a two-dotted line, causing support piece 14' to be halfway deflected, and that inspection pin 11 is coming in this condition. In this case, too, since the driving surfaces 11c' at opposite sides of the front end of inspection pin 11 abut against the driven surfaces 14c' at the end of support pieces 14' to pick up and displace support piece 14' inside space 16, the entrance of inspection pin 11 will be securely prevented. Thus, while a terminal lug is being in incompletely-inserted position, incomplete-insertion detector portion 11b of inspection pin 11 is prevented from being unintentionally forcibly pushed into the resilient-displacement allowing space, thereby to prevent damages or distortions to the resilient support piece 14.

Having now fully described the invention, it will be apparent to one of ordinary skill in the art that many changes and modifications can be made thereto without departing from the spirit and scope of the invention as set forth herein.

What is claimed is:

1. An inspection device for connectors comprising:

a connector support and an inspection main body movable relative to each other;

a plurality of inspection pins provided in said inspection main body, each connected to an inspecting electric circuit, each normally urged towards said connector support by a spring, and each having a continuity-test surface and an incomplete-insertion detector portion which protrudes past said continuity-test surface towards said connector support;

a connector to be inspected which comprises a housing and a plurality of terminal-accommodating chambers formed in said housing, and terminal lugs inserted in said terminal-accommodating chambers to be locked therein, each of said terminal-accommodating chambers containing a resilient cantilever support piece and a space adjacent said support piece inside which said support piece is resiliently displaced while being contacted and pressed by a related terminal lug; and a first abutment means at a front end of each of said incomplete-insertion detector portions, which is engageable, when said related terminal plug is in incompletely-inserted position, with a second abutment means on said related support piece so that said incomplete-insertion detector portion is prevented from entering said space, and which is not engageable, when said related terminal lug is in fully-inserted position, with said second abutment means so that said incomplete-insertion detector portion is allowed to enter said space, and that said continuity-test surface is brought into contact with said related terminal lug in locked position, wherein said first abutment means comprises a tapered driving surface and said second abutment means comprises a corresponding tapered driven surface, said tapered driving surface being tapered such that, on contact with said tapered driven surface, said tapered driving surface causes said tapered driven surface and thus said support piece to be resiliently displaced inside said space.

2. The inspection device according to claim 1, wherein said tapered driven surface is tapered towards said front end of said incomplete-insertion detector portion, on a first side opposite a second side where said space is provided, and said tapered driven surface is tapered complementarily.

3. The inspection device according to claim 1, wherein said terminal lug comprises a hole therein which said support piece engages when said terminal lug is in fully-inserted position so as to lock said terminal lug in position.

4. The inspection device according to claim 1, wherein each of said terminal-accommodating chambers further contains a step on a first side opposite a second side where said support piece is provided, and said terminal lug comprises a hole therein in which said step engages when said terminal lug is in fully-inserted position, and wherein said terminal lug is maintained in said locked position by said support piece pressing said terminal lug.

5. The inspection device according to claim 1, wherein said tapered driven surface comprises a pair of tapered surfaces provided protruding forwardly at lateral opposite sides of said front end of each of said incomplete-insertion detector portions, and said tapered driven surface comprises a pair of tapered surfaces provided correspondingly on each of said support pieces.

6. A connector comprising:

a housing;

a plurality of terminal-accommodating chambers formed in said housing, with terminal lugs inserted in said terminal-accommodating chambers to be locked therein, each of said terminal-accommodating chambers containing a resilient cantilever support piece and a space adjacent said support piece inside which said support piece is resiliently displaced while being contacted and pressed by a related terminal lug; and an abutment means on each of said support pieces engageable, when said related terminal lug is in incompletely-inserted position, with a corresponding abutment means at a front end of an incomplete-insertion detector portion of a related inspection pin of an inspection device for connectors, so that said detector portion is prevented from entering said space, wherein said abutment means include a tapered driven surface and said corresponding abutment means include a corresponding tapered driving surface, said tapered driven surface being tapered such that, on contact with said tapered driving surface, said tapered driven surface and thus said support piece is resiliently displaced inside said space.

* * * * *